United States Patent [19]

Fior

[11] Patent Number: 4,889,588
[45] Date of Patent: Dec. 26, 1989

[54] PLASMA ETCH ISOTROPY CONTROL

[75] Inventor: Gianni O. Fior, Albany, Calif.

[73] Assignee: Tegal Corporation, Petaluma, Calif.

[21] Appl. No.: 345,795

[22] Filed: May 1, 1989

[51] Int. Cl.⁴ .................... B44C 1/22; C03C 15/00; C03C 25/06
[52] U.S. Cl. .................... 156/643; 156/646; 156/651; 156/653; 156/657; 156/659.1; 156/345; 204/192.37; 204/298
[58] Field of Search ............... 156/643, 644, 646, 651, 156/653, 657, 659.1, 662, 345; 204/192.37, 298.34, 298.06; 427/38, 39; 437/238

[56] References Cited

U.S. PATENT DOCUMENTS

| 4,464,223 | 8/1984 | Gorin | 204/298.34 X |
| 4,484,978 | 11/1984 | Keyser | 156/651 X |
| 4,572,759 | 2/1986 | Benzing | 156/345 |
| 4,729,815 | 3/1988 | Leung | 156/643 |

Primary Examiner—William A. Powell
Attorney, Agent, or Firm—Paul F. Wille

[57] ABSTRACT

A tapered profile is obtained in oxide etched in a plasma glow discharge by switching the RF power between the side and lower electrodes in a tri-electrode reactor. The etch is isotropic while the RF power is applied to the side electrode and is anisotropic when the RF power is applied to the lower electrode.

7 Claims, 1 Drawing Sheet

PLASMA ETCH ISOTROPY CONTROL

BACKGROUND OF THE INVENTION

This invention relates to improved apparatus and processes for the manufacture of semiconductor wafers by means of a plasma etch and, in particular, to etching sloped contacts and vias in dielectric layers.

In the prior art, a variety of techniques have been proposed or even used for etching access holes, vias, in dielectric layers to connect conductive layers at different levels or to open contact areas to devices formed on a wafer. One technique comprises coating the wafer with photoresist, transferring a pattern into the photoresist, heating the photoresist so that it softens, thereby rounding the corners formed and encroaching slightly into the bottom of the opening formed previously, then etching both the photoresist and the underlying dielectric layer. The taper of the aperture formed in the dielectric depends upon the relative etch rates of the dielectric and the photoresist and on the slope of the photoresist at the start of the etch, among other factors.

A problem with this technique is the change in the dimension of the aperture in the photoresist. One has difficulty ensuring that the effect of the bake is always the same so that the resulting geometry of the opening in the dielectric is always the same. Inconsistent results are known as "loss of critical dimension." This problem becomes particularly acute as device geometries become smaller.

Another technique is to perform a multi-step, repetitive switching of chemistries to etch the dielectric slightly, then the photoresist, then the dielectric, then the photoresist, etc. The result is a stairstep profile which approximates the desired taper. As might be expected, reproducibility becomes a significant problem, as is dimensional control. A similar technique, described in U.S. Pat. No. 4,764,245, varies the composition of the gas mixture to change the selectivity of the etch.

Another technique, described in U.S. Pat. No. 4,764,249, requires placing an aperture mask some distance from the wafer and anisotropically etching the dielectric through the mask. While having the advantage of not requiring process changes, one has substituted equipment changes for the process changes, with the resultant problem of reproducibility. Further, one has a problem assuring registration of the mask with the appropriate portions of the wafer, particularly at small geometries.

In view of the foregoing, it is therefore an object of the present invention to provide an improved process for forming vias having a predetermined slope.

Another object of the present invention is to provide a process for forming vias having a predetermined slope without chemical or mechanical changes.

SUMMARY OF THE INVENTION

The foregoing objects are achieved in the present invention wherein chemical etching is separated from ion assisted etching, enabling one to dry etch silicon dioxide isotropically and anisotropically, respectively. The chemical etch is obtained, in part, by operating a tri-electrode reactor with the side electrode powered. The ion assisted etch is obtained, in part, by operating a tri-electrode reactor with the lower, or wafer, electrode powered. The top electrode remains grounded. The unused electrode is permitted to float electrically.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
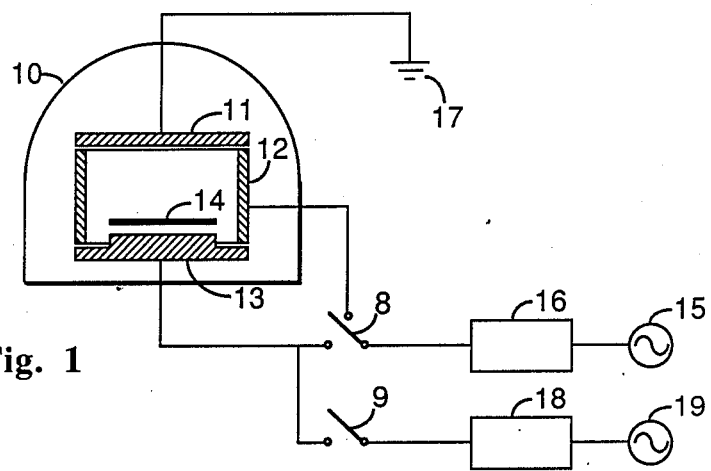
FIG. 1 illustrates a preferred embodiment of apparatus for carrying out the method of the present invention.

FIG. 1 illustrates a preferred embodiment of apparatus for carrying out the present invention. While such apparatus preferably comprises what is known as a tri-electrode plasma reactor.

In FIG. 1, the plasma reactor comprises chamber 10 containing upper electrode 11, cylindrical sidewall electrode 12, and lower or wafer electrode 13. Wafer electrode 13 is configured to receive semiconductor wafer 14 which rests thereon. Electrodes 11, 12, and 13 form the three electrodes of the tri-electrode reactor. For operation in a reactive ion etch (RIE) mode, one simply supplies RF power to lower or wafer electrode 13 with side electrode 12 either floating or connected to an RF source having a different frequency from that supplied to wafer electrode 13.

As understood by those of skill in the art, FIG. 1 illustrates a plasma reactor in greatly simplified form. For example, gas supply and exhaust means are not illustrated. Any suitable means, well known per se to those skilled in the art can be used. Similarly, wafer 14 is placed on and removed from electrode 13 by any suitable means, not shown. Additional, common features such as electrode heating or cooling means or various optical detectors typically used in plasma reactors can be used in equipment for implementing the present invention.

Upper electrode 11, which typically contains gas supply and exhaust mechanisms, is electrically grounded. Either electrode 12 or electrode 13 is connected through switch 8 to RF power source 15. Interposed between power source 15 and switch 8 is matching network 16. Matching network 16 is well known per se to those of ordinary skill in the art and can include isolation filters as well. Electrode 13 is also connected through switch 9 and impedance matching network 18 to RF source 19. Switch 9 comprises a single pole single throw switch. Switch 8 comprises a single pole double throw switch.

As understood by those of skill in the art, switches 8 and 9 are merely illustrated as mechanical switches for the sake of simplicity. In typical apparatus, electronic switching would be use to achieve the same function. Such electronic switching is well known to those of skill in the art for many years.

In a preferred embodiment of the present invention, source 15 comprises a frequency of 13.56 MHz. and a maximum power of 1000 watts. RF source 19 preferably comprises a frequency of 100 KHz and a maximum power of 250 watts. While other frequencies and maximum powers can be used, the foregoing are typical in the art, are not critical, and comply with government regulations concerning electromagnetic interference.

For oxide etching, a fluorine based chemistry is used, e.g. $NF_3$.

Figure 2:
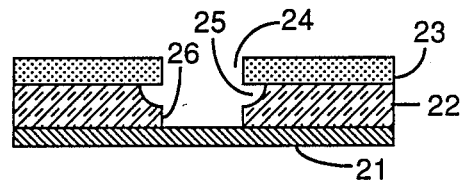
FIG. 2 illustrates the effect of the present invention on a semiconductor wafer.

The present invention achieves its result not by changing processes or mechanically altering the chamber, but by utilizing switch 8 or switches 8 and 9 together to apply RF power to selected electrodes, thereby changing between isotropic and anisotropic etches of the oxide to produce a tapered edge. FIG. 2 illustrates the result of the process in accordance with the present invention, wherein a tapered hole or via is formed in an oxide layer on a semiconductor wafer. Specifically, semiconductor wafer 21 has oxide layer 22 formed thereon. Overlying oxide layer 22 is photoresist layer 23. The photoresist layer is suitably patterned to form aperture 24.

A tapered etch is obtained by utilizing a tri-electrode reactor and switching the applied power between the side electrode and the wafer electrode. As the first step, when side electrode 12 is powered by way of switch 8, the oxide is isotropically etched, as indicated in FIG. 2 by reference numeral 25. The photoresist is etched little, if at all. The lower electrode is floating electrically. A chemical etch using radicals, not ions, is used.

As a second step, the etch is made anisotropic by applying RF power from source 15 and/or source 19, by suitable actuation of switches 8 and 9, to lower electrode 13. Sources 15 and 19 are not both coupled to lower electrode 13 unless there are isolation circuits in networks 16 and 18 to electrically separate the sources from each other. Applying power to lower electrode 13 causes an anisotropic etch to take place, as indicated in FIG. 2 by reference numeral 26. The side electrode is preferably electrically floating, although it could be powered by source 15. The etch performed is a reactive ion etch using ion bombardment.

Having thus described the invention it will be apparent to those of skill in the art that various modifications can be made within the spirit and scope of the present invention. For example, as previously noted, the particular powers and frequencies used are not critical but are merely typical of those used presently in the art. Thus, one can easily implement the present invention with existing equipment and a minimum of additional circuitry. The profile can be varied during the etch by combining pulsed RF with CW power. While described as a single anisotropic-isotropic etch cycle, it is understood that the cycle can be repeated as necessary to achieve the desired depth and profile. While described in a preferred embodiment in conjunction with oxide, it is understood that the present invention can be used on other materials as well, e.g. nitride or silicon.

I claim:

1. In a method for treating a semiconductor wafer subjected to a plasma glow discharge in a tri-electrode reactor having top, side, and lower electrodes, the improvement comprising:
   placing a wafer to be treated on said lower electrode;
   applying RF power only between the top and side electrodes of said reactor to cause an isotropic etch of said wafer; and
   applying RF power between the top and lower electrodes of said reactor to cause an anisotropic etch of said wafer.

2. The method as set forth in claim 1 wherein said lower electrode is connected to a source of pulsed RF power.

3. The method as set forth in claim 2 and further comprising the step of alternately connecting said RF power to said side electrode and to said lower electrode.

4. In a method for etching an oxide layer on a semiconductor wafer subjected to a plasma glow discharge in a tri-electrode reactor having top, side, and lower electrodes, the improvement comprising:
   applying RF power between the top and side electrodes of said reactor to cause an isotropic etch of said oxide layer; and
   applying RF power between the top and lower electrodes of said reactor to cause an anisotropic etch of said oxide layer.

5. In apparatus for etching an oxide layer on a semiconductor wafer in a plasma glow discharge sustained by RF power in a gas contained within a reactor chamber; wherein said reactor has two, parallel plate electrodes of which one is connected to RF ground; a third, sidewall electrode enclosing at least a portion of the region between the other two electrodes; wherein the improvement comprises:
   means for alternately connecting RF power to said second and third electrodes.

6. The apparatus as set forth in claim 5 and further comprising a source of RF power and wherein said means for connecting comprises switch means for connecting said source of RF power alternately to the second and third electrodes to cause said etch to be alternately anisotropic and isotropic, thereby causing a tapered sidewall in the etched portion of said oxide layer.

7. The apparatus as set forth in claim 5 and further comprising two sources of RF power connected one each to said second and third electrodes, wherein said sources of RF power are of different frequencies.

* * * * *